(12) United States Patent
Kwon et al.

(10) Patent No.: US 7,956,648 B2
(45) Date of Patent: Jun. 7, 2011

(54) OUTPUT DRIVER ROBUST TO DATA DEPENDENT NOISE

(75) Inventors: Chang Ki Kwon, Boise, ID (US); Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/410,906

(22) Filed: Mar. 25, 2009

(65) Prior Publication Data

US 2009/0179665 A1 Jul. 16, 2009

Related U.S. Application Data

(62) Division of application No. 11/881,262, filed on Jul. 26, 2007, now Pat. No. 7,521,967, which is a division of application No. 11/218,988, filed on Sep. 1, 2005, now Pat. No. 7,253,655.

(51) Int. Cl.
*H03K 9/00* (2006.01)

(52) U.S. Cl. .............................. 326/93; 326/29; 327/170

(58) Field of Classification Search .................... 326/93, 326/21–22, 29; 327/141, 161–163, 170, 327/172–175
See application file for complete search history.

(56) References Cited

U.S. PATENT DOCUMENTS

| | | | |
|---|---|---|---|
| 4,859,877 A | 8/1989 | Cooperman et al. | |
| 5,381,059 A | 1/1995 | Douglas | |
| 6,172,522 B1 | 1/2001 | Kerr et al. | |
| 6,617,877 B1 * | 9/2003 | Cory et al. | .......... 326/41 |
| 7,705,633 B2 * | 4/2010 | Pitkethly | .......... 326/87 |
| 7,721,137 B2 * | 5/2010 | Lin et al. | .......... 713/503 |

OTHER PUBLICATIONS

Matano et al.; "A 1-Gb/s/pin 512-Mb DDRII SDRAM Using a Digital DLL and a Slew-Rate-Controlled Output Buffer"; IEEE Journol of Solid-State Circuits, vol. 38, No. 5, May 2003.
Actel Appliction Note; "Simultaneous Switching Noise and Signal Integrity"; Actel Corporation, Jul. 2003.
Park et al.; "A High-Speed Memory Interface Circuit Tolerant to PVT Variations and Channel Noise"; unknown date.
Kirk; "Clock Management with PLLs and DLLs"; EETimes Online; EETimes.com posted Mar. 28, 2001.
Abramovitch; "Phase-Locked Loops: A Control Centric Tutorial"; Agilent Technologies; Agilent Labs; May 8, 2002; pp. 1-50.
E-learning Resources in Microelectronics; "Signal Integrity in Digital Circuits", Lesson 3-Ground Bounce and Switching Noise; Jun. 8, 2001.

\* cited by examiner

*Primary Examiner* — James Cho
(74) *Attorney, Agent, or Firm* — Fletcher Yoder

(57) ABSTRACT

Techniques for controlling a driver to reduce data dependent noise, such as simultaneous switching effects and cross-talk effects. A plurality of drivers may each receive a data segment to transmit and a plurality of data segments that other drivers will transmit. A driver controller may adjust the time at which the data segment is transmitted in response to the plurality of data segments that the other drivers will transmit. The adjustment may compensate for simultaneous switching noise and cross-talk by, for example, delaying the transmission of a data segment or changing the slew rate of the signal carrying the data segment.

17 Claims, 8 Drawing Sheets

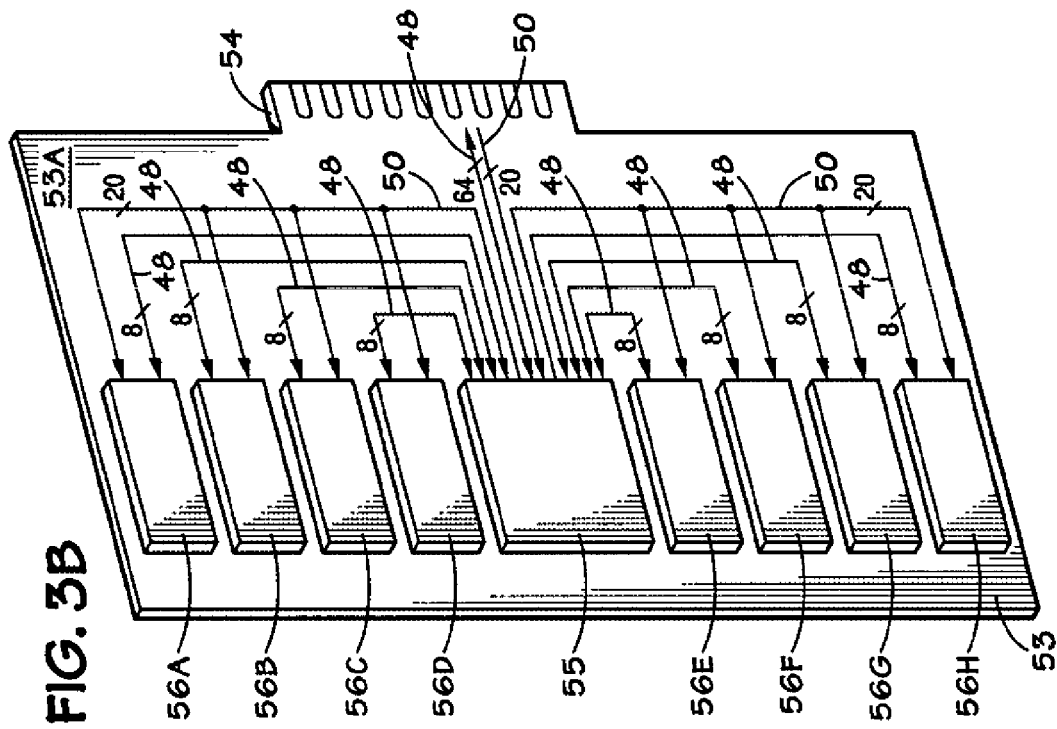
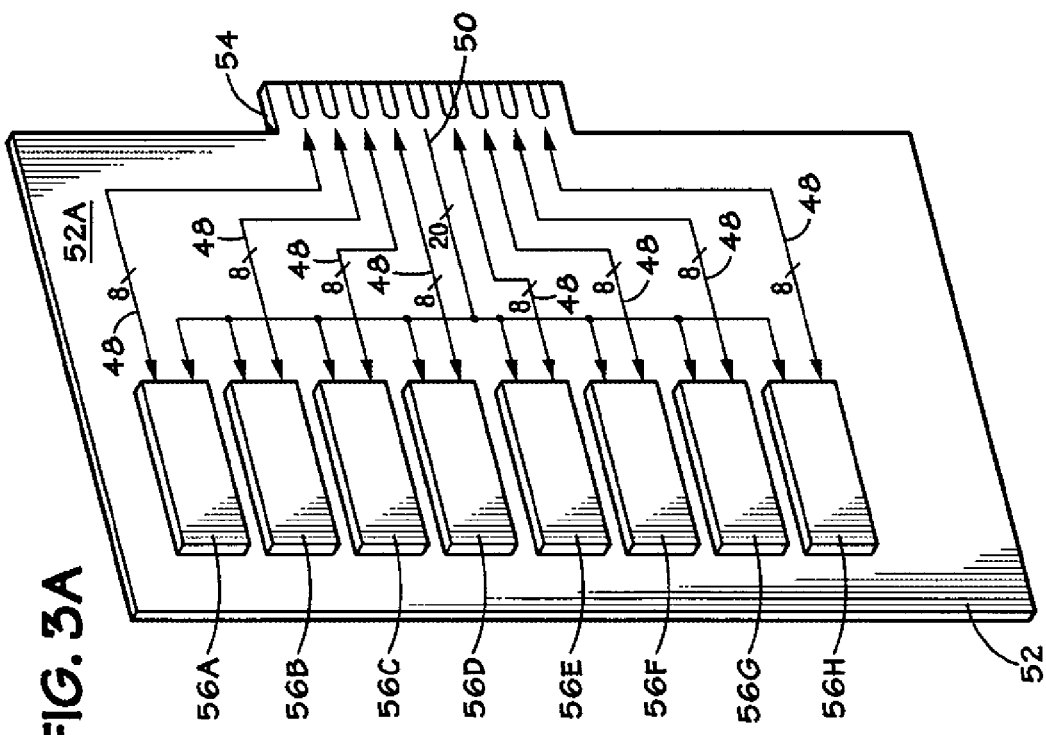

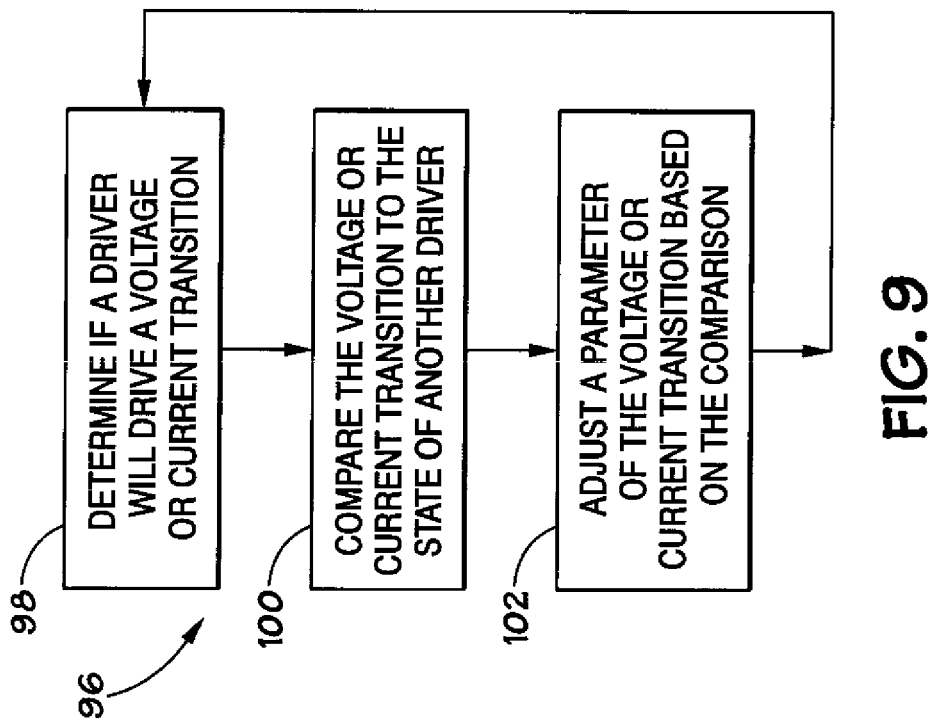
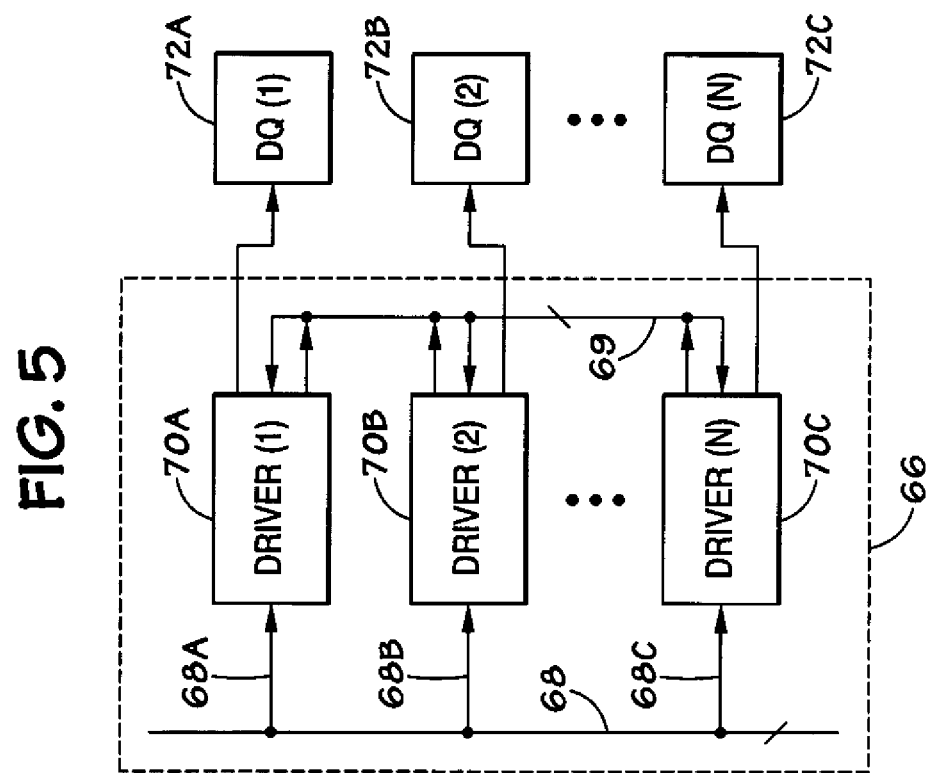

OUTPUT DRIVER ROBUST TO DATA DEPENDENT NOISE

This application is a divisional of U.S. patent application Ser. No. 11/881,262, filed on Jul. 26, 2007, which is a divisional of U.S. patent application Ser. No. 11/218,988, filed on Sep. 1, 2005, now U.S. Pat. No. 7,253,655, which issued on Aug. 7, 2007.

BACKGROUND OF THE INVENTION

1. Field of the Invention

The present invention relates generally to voltage or current mode output drivers and, more specifically, to techniques for controlling a driver in an on-chip memory interface or in an off-chip memory interface to compensate for data dependent noise.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Processing speeds, system flexibility, and size constraints are typically considered by design engineers tasked with developing computer systems and system components. Computer systems typically include a plurality of memory devices which may be used to store programs and data and which may be accessible to other system components such as processors or peripheral devices. Typically, memory devices are grouped together to form memory modules such as dual-inline memory modules (DIMMs). Computer systems may incorporate numerous modules to increase the storage capacity of the system.

Typically, the memory devices communicate with other components within the computer system. For example, a processor may send an instruction to the memory device requesting data stored in a particular address. The memory device may then retrieve that data and send it to a memory controller, which forwards the data to the processor. In another example, the processor may instruct the memory device, through the memory controller, to store data in a particular address. Thus, the processor, memory controller, and memory all may communicate with one another to coordinate various system requests and functions.

Often, the various devices within the computer system communicate by actuating and sensing discrete changes in the voltage or current of one or more transmission lines. For example, to transmit a value from memory, a memory device may apply a voltage to one or more transmission lines coupled to a receiving device. Typically, to receive a value being transmitted, a receiving device senses the voltage of the transmission line. For instance, to transmit eight bits of data simultaneously, a memory device may alter the voltage of eight transmission lines that are coupled to a receiving device. Typically, once the voltage on all eight transmission lines correspond to the values being transmitted, a receiving device senses the voltages to receive the data. After a sufficient delay to ensure the receiving device properly senses the voltage on the transmission lines, the memory device may repeat the process and alter the voltage on the transmission lines to transmit another eight bits. Thus, by changing the voltage of one or more transmission lines, the memory device may transmit a sequence of values to other devices. This sequence of values is referred to as a "data stream."

Memory devices often employ components configured to drive a transmission line to a desired voltage. Typically, a memory device connects to each transmission line through a contact referred to as a "DQ." Inside a memory device, a driver array typically drives each transmission line to a desired voltage by passing current through the DQs. Typically, a driver array controls the voltage applied to each DQ in response to signals from other portions of the memory device. For example, the memory device may retrieve stored data and direct the driver array to transmit the data to another device.

Driver arrays often employ driver circuits to strengthen signals that are transmitted to other devices. Often, the signals within a memory device are relatively weak. To reduce the cost of memory devices, designers often employ small-densely packed transistors to perform most internal functions. However, these smaller transistors often lack the current carrying capacity to quickly drive a relatively long transmission line to a desired voltage. To compensate, signals from the smaller transistors are often passed through a driver circuit, which typically employs larger transistors. Often, the larger transistors are configured to carry larger currents, which may quickly alter the voltage of a transmission line to reflect the information carried by the weaker-internal signal.

In some devices, a driver circuit includes a sub-main driver, a sub-pre-driver, and a sub-pre-pre-driver to strengthen a signal in stages. The larger transistors employed by a driver circuit may take a long time for the smaller internal transistors to turn on. By stepping up the signal strength in stages, these delays may be avoided. For example, a weak signal carried by a small current may quickly activate an intermediate sized transistor in the sub-pre-pre-driver, generating a signal carried by a larger current. In turn, the signal from the sub-pre-pre-driver may quickly activate a larger transistor in the sub-pre-driver, generating a signal carried by even more current. Finally, the signal from the sub-pre-driver may activate an even larger transistor in the sub-main driver, permitting an even larger current to flow into or out of a transmission line and rapidly change the transmission line voltage.

Designers of computer systems often desire to decrease the time a memory device takes to transmit data to another device. Often, modern processors have the capacity to process data faster than a memory device can transmit the data. During certain computing tasks, the rate at which the memory device exchanges data with the processor may determine how long the computing task takes. Thus, by decreasing the time a memory device takes to transmit data, a designer may speed the operation of a computer system by performing more computing tasks in less time.

One technique to speed the transmission of data is to increase the number of signals sent simultaneously. For example, a designer may increase the number of transmission lines connecting two devices from 8 to 16. To match the number of transmission lines, the designer may also increase the number of DQs and driver circuits from 8 to 16. As a result, the memory device may send 16 bits at once, rather than just 8. Typically, more transmission lines permit a device to send more data simultaneously. Data that is sent simultaneously, on multiple transmission lines, is often referred to as a "data word." Thus, by increasing the size of the data word, a designer may speed the transmission of data from a memory device.

Another technique to speed the transmission of data is to decrease the time between sequential signals. To this end, a designer may increase the rate at which a driver circuit changes the voltage of a transmission line. Between signals, the driver circuits may drive the voltage of a transmission line from a high voltage to a low voltage, from a low voltage to a high voltage, or leave the voltage unchanged, depending on the sequence of data. The rate at which a voltage changes as a signal is applied to a transmission line is often referred to as a "slew rate." Thus, by increasing the slew rate of a signal, the memory device may transmit signals more quickly.

Data dependent noise often limits the success of these two techniques for speeding the transmission of data. Data dependent noise includes effects that interfere with the transmission of data to a degree that depends on the data being transmitted. Often, the interference varies the time it takes for signals to reach the receiving device. Variation in the time a signal takes to reach a receiving device may slow the transmission of data from a memory device. Often, a memory device sends several signals simultaneously in the form of a data word. Typically, in synchronous systems, a receiving device simultaneously senses the voltage of all the transmission lines to read the data word. Often, the receiving device delays before sensing the voltage on the transmission lines to ensure all the transmission lines have reached the desired voltage. Variation in the time a transmission line takes to transition between voltages may necessitate a larger delay, slowing the exchange of data. Thus, data dependent noise often imposes limits on the time between transmission of consecutive data words.

Various phenomena may contribute to data dependent noise. For instance, cross-talk between the signals may delay signals in a data dependent manner. The term "cross-talk" refers to the electromagnetic coupling of adjacent transmission lines. The transmission lines are often placed very close to one another to conserve space. As a result, adjacent transmission lines may form parasitic capacitors and inductors that slow abrupt transitions in voltage or current, such as those that occur between consecutive data words. The magnitude of the effect often depends on the voltage and current of adjacent transmission lines, i.e. the data carried by adjacent transmission lines. Consequently, cross-talk may introduce data dependent variation into the time a memory device takes to drive a signal.

Simultaneous switching noise may add further variation to the time a transmission line takes to transition between voltages. Typically, a driver circuit adjusts the voltage on each transmission line to reflect the value of the data being transmitted. Because a signal may travel over relatively long transmission lines, the driver circuit may draw a relatively large current to quickly change the voltage of the transmission line. Often, many driver circuits share a common power source. When a large number of transmission lines change voltage simultaneously, the current between the driver circuits and the power source may abruptly rise. As a result, the abrupt change in current may cause parasitic inductance or a voltage drop in an internal power bus, slowing the efforts of the driver circuits to change the voltage on certain transmission lines. Thus, when several transmission lines change voltage at the same time, the driver circuits may take longer to adjust the voltage. Consequently, the difference between each value in consecutive data words may affect how long the driver circuits take to transmit some of the values in the latter data word.

To increase the speed at which devices communicate, there is a need for a technique that reduces data dependent noise. Embodiments of the present invention may address one or more of these problems.

BRIEF SUMMARY

Techniques for mitigating data dependent noise are provided. In certain embodiments, a plurality of drivers may each include a driver controller to compensate for data dependent noise. Each driver controller may monitor the sequence of data transmitted by the plurality of drivers to determine when data dependent noise is likely to occur. Moreover, the driver controller may adjust a parameter of a signal transmitted by a driver affected by data dependent noise to compensate for the effect. In some embodiments, the adjustment may compensate for cross-talk and simultaneous switching noise.

BRIEF DESCRIPTION OF THE DRAWINGS

Advantages of the invention may become apparent upon reading the following detailed description and upon reference to the drawings, in which:

FIG. 3A illustrates an exemplary memory module, which may be fabricated in accordance with embodiments of the present invention;

FIG. 3B illustrates an exemplary memory module including an advanced memory buffer, which may be fabricated in accordance with embodiments of the present invention;

FIG. 5 illustrates a block diagram of a driver array, which may be fabricated in accordance with embodiments of the present invention;

FIG. 9 is a flow chart depicting the operation of an exemplary driver controller in accordance with embodiments of the present invention;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming but would nevertheless be a routine undertaking of design, fabrication, and manufacture for those of ordinary skill having the benefit of this disclosure.

As discussed above, data dependent noise may limit the speed at which synchronous devices communicate. Data dependent noise may introduce variation in the time a signal takes to reach a receiving device. This variation may necessitate delays between consecutive signals to ensure all the transmission lines reach a voltage that is representative of the data word. For example, cross-talk and simultaneous switching noise may interfere with the rapid communication of data between devices.

Embodiments of the present invention may address some of these issues. As is described in much more detail below, a driver controller associated with each driver circuit may monitor the data transmitted by other driver circuits. By determining when the data being transmitted by the other driver circuits is such that data dependent noise is likely to affect the transmission of a signal from its associated driver, the driver controller may compensate for data dependent effects. For example, the driver controller may adjust the slew rate or timing of a signal to compensate for cross-talk and simultaneous switching noise, as described further below.

Figure 1:
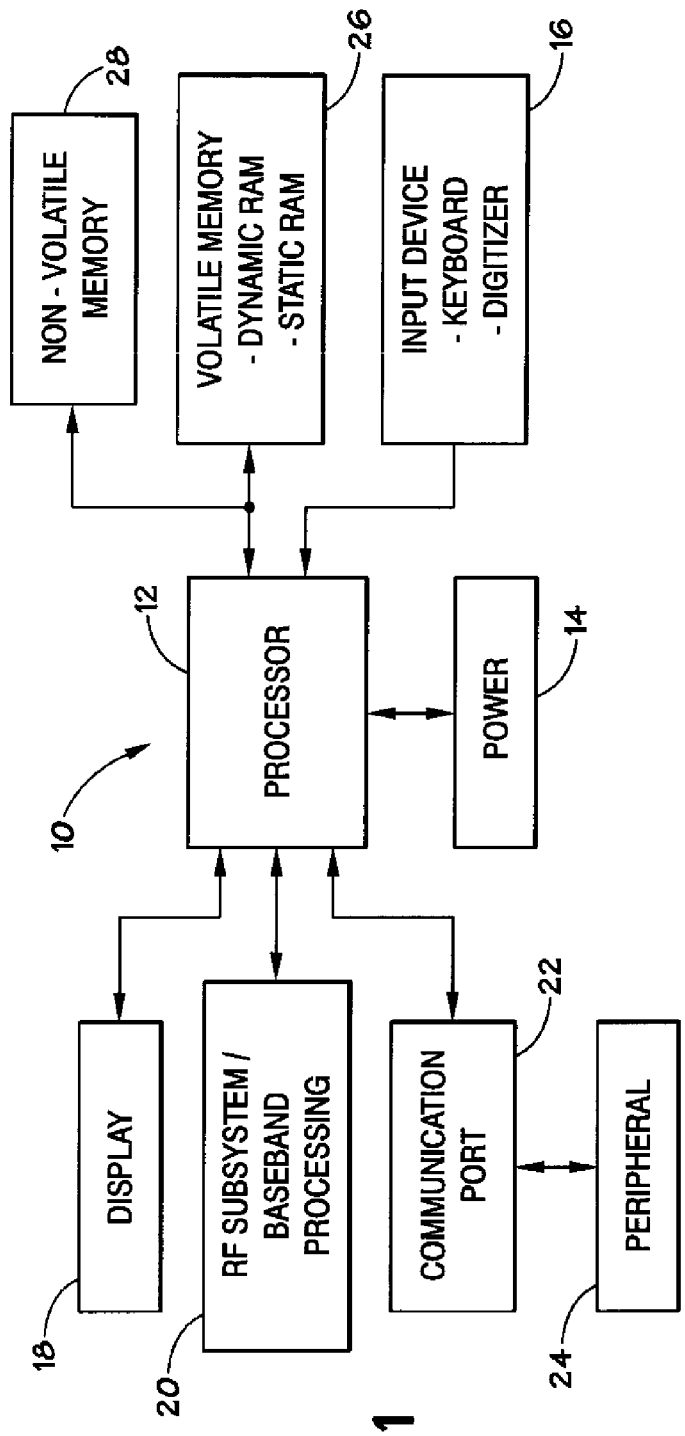
FIG. 1 illustrates a block diagram of an exemplary processor-based system in accordance with embodiments of the present invention.

Turning to the figures, FIG. 1 depicts an exemplary processor-based system, generally designated by reference numeral 10. The system 10 may be any of a variety of types such as a computer, pager, cellular phone, personal organizer, control circuit, etc. In a typical processor-based system, one or more processors 12, such as a microprocessor, control the processing of system functions and requests in the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD, a CRT display, a DLP display, an OLED display, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

The processor 12 generally controls the system 10 by implementing software programs stored in the memory. The memory is operably coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 is typically large so that it can store dynamically loaded applications and data. As described further below, the volatile memory 26 may be configured in accordance with embodiments of the present invention.

The processor 12 may also be coupled to non-volatile memory 28. The non-volatile memory 28 may include a read-only memory (ROM), such as an EPROM, and/or flash memory to be used in conjunction with the volatile memory 26. The size of the ROM is typically selected to be just large enough to store any necessary operating system, application programs, and fixed data. Additionally, the non-volatile memory 28 may include a high capacity memory such as a tape or disk drive memory.

Figure 2:
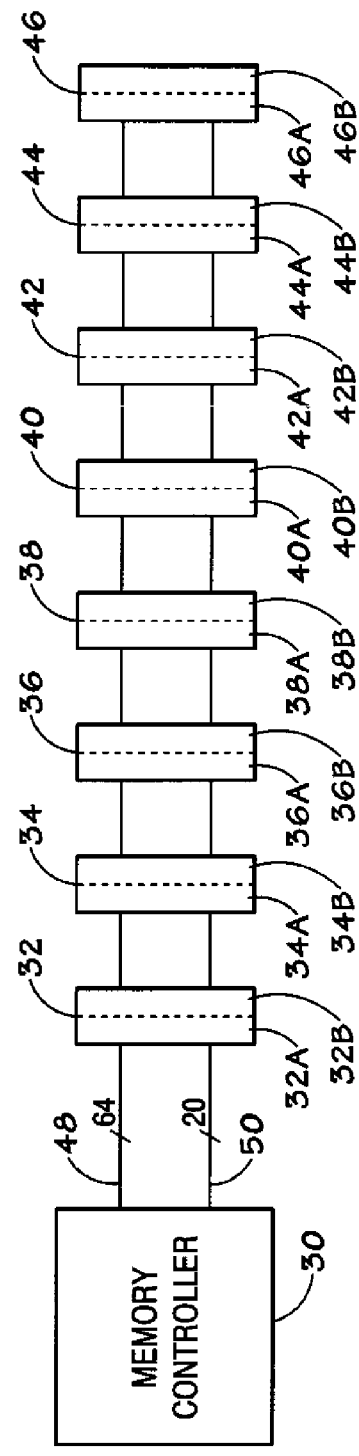
FIG. 2 illustrates an exemplary memory sub-system in accordance with embodiments of the present invention.

FIG. 2 generally illustrates a block diagram of a portion of a memory sub-system, such as the volatile memory 26. A memory controller 30 is generally provided to facilitate access to storage devices in the volatile memory 26. The memory controller 30 may receive requests to access the storage devices via one or more processors, such as the processor 12, via peripheral devices, such as the peripheral device 24, and/or via other systems (not shown). The memory controller 30 is generally tasked with facilitating the execution of the requests to the memory devices and coordinating the exchange of information, including configuration information, to and from the memory devices.

The memory sub-system may include a plurality of slots 32-46. Each slot 32-46 is configured to operably couple a memory module, such as a dual-inline memory module (DIMM), to the memory controller 30 via one or more memory buses. Each DIMM generally includes a plurality of memory devices such as dynamic random access memory (DRAM) devices capable of storing data, as described further below with reference to FIGS. 3A and 3B. As described further below, each DIMM has a number of memory devices on each side of the module. Each side of the module may be referred to as a "rank." Accordingly, each slot 32-46 is configured to receive a single DIMM having two ranks. For instance, the slot 32 is configured to receive a DIMM having ranks 32A and 32B, the slot 34 is configured to receive a DIMM having ranks 34A and 34B, and so forth. In the present exemplary embodiment, each of the eight memory slots 32-46 is capable of supporting a module comprising eight individual memory devices on each rank 32A/B-46A/B, as best illustrated with respect to FIGS. 3A and 3B, described further below.

Referring again to FIG. 2, the memory buses may include a memory data bus 48 to facilitate the exchange of data between each memory device on the DIMMs and the memory controller 30. The memory data bus 48 comprises a plurality of single bit data buses, or transmission lines, each coupled from the memory controller 30 to a memory device. In one embodiment of the volatile memory 26, the memory data bus 48 may include 64 individual data buses. Further, the memory data bus 48 may include one or more individual buses to each memory rank 32A/B-46A/B which may be used for ECC error detection and correction. As can be appreciated by those skilled in the art, the individual buses of the memory data bus 48 will vary depending on the configuration and capabilities of the system 10.

The volatile memory 26 also includes a command bus 50 on which address information such as command address (CA), row address select (RAS#), column address select (CAS#), write enable (WE#), bank address (BA), chip select (CS#), clock enable (CKE), and on-die termination (ODT), for example, may be delivered for a corresponding request. Further, the command bus 50 may also be used to facilitate the exchange of configuration information at boot-up. As with the memory data bus 48, the command bus 50 may comprise a plurality of individual command buses. In the present embodiment, the command bus 50 may include 20 individual buses. As previously described with reference to the memory data bus 48, a variety of embodiments may be implemented for the command bus 50 depending on the system configuration.

FIGS. 3A and 3B illustrate exemplary memory modules 52 and 53, such as a DIMM, that may be inserted into one of the memory slots 32-46 (FIG. 2). In the present exemplary views, one side of the memory modules 52 and 53 is illustrated, and generally designated as the ranks 52A and 53A respectively. As previously discussed, the memory modules 52 and 53 may each include two ranks 52A and 52B and 53A and 53B respectively. The ranks 52A and 53A include a plurality of memory devices 56A-56H, such as dynamic random access memory (DRAM) devices, which may be used for storing information. As will be appreciated, the second opposing side of the memory modules 52 and 53 (52B and 53B, not shown) also includes a number of memory devices. The memory modules 52 and 53 may include an edge connector 54 to facilitate mechanical coupling of the memory modules 52 and 53 into one of the memory slots 32-46. Further, the edge connector 54 provides a mechanism for electrical coupling to facilitate the exchange of data and control signals from the memory controller 30 to the memory devices 56A-56H (and the memory devices on the second ranks) or an advanced memory buffer (AMB) 55 on the memory modules 52 and 53. In high speed applications, the memory module 53 may employ an AMB 55 to provide point-to-point channels between the memory devices 56A-56H and the AMB 55. A number of memory modules 52 or 53 may be coupled together to increase a system's memory. For example, a number of memory modules 52 or 53 may be coupled together in a ring or daisy-chain arrangement.

The embodiments of FIGS. 3A and 3B may be employed in accordance with various standards. For instance, the memory module 52 may be employed in a single data rate (SDR), double data rate (DDR), and double data rate 2 (DDR2) system 10. Similarly, the memory module 53 may be employed in a DDR2, double data rate 3 (DDR3), or faster system 10. However, it should be noted that embodiments in accordance with the present techniques are not limited to systems that are compliant with these standards or to systems including memory devices.

Figure 4:
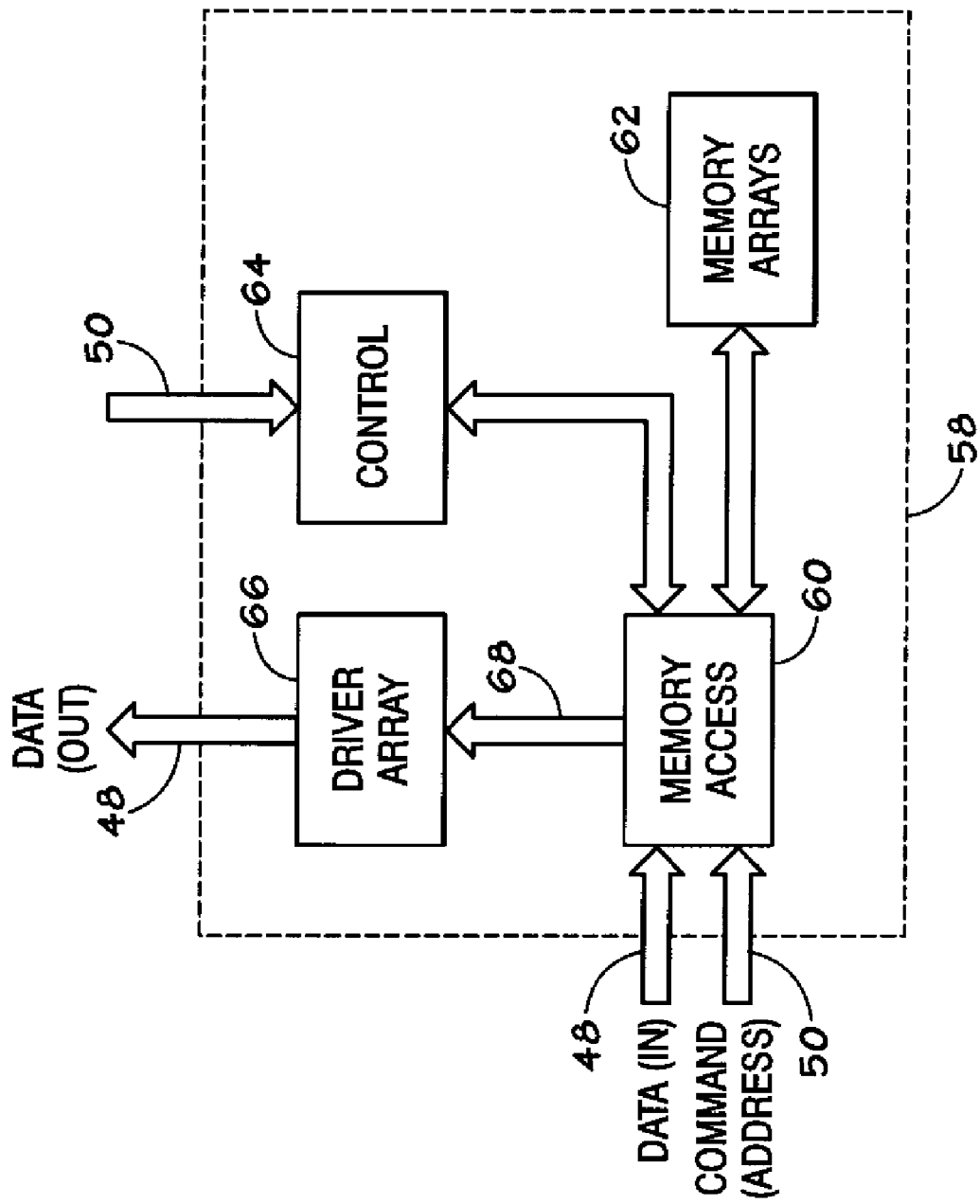
FIG. 4 illustrates a block diagram of an exemplary memory device, which may be fabricated in accordance with embodiments of the present invention.

FIG. 4 is a block diagram depicting an exemplary memory device, such as the memory devices 56A-56H, fabricated in accordance with the present invention, and generally designated as memory device 58. The memory device 58 may receive and send data through the data bus 48. In the exemplary embodiment of FIG. 4, a memory access block 60 receives addresses and sends and receives data. Among other things, the memory access block 60 may accept an address through the command bus 50, access the appropriate memory cells within a memory array 62, and return the stored data through the data bus 48 or write data on the data bus 48 to the memory array 62. The memory access block 60 may include row and column address buffers, row and column decoders, sense amplifiers, and data input and driver arrays. The memory access block 60 interfaces with the memory array 62, which may include a plurality of memory cells arranged in rows and columns. In one embodiment, a memory cell stores data in the charge state of a capacitor accessed through an access transistor unique to that memory cell.

As depicted in FIG. 4, a control block 64 may direct the operation of the memory access block 60 and the memory array 62. In this embodiment, the control block 64 accepts commands from other devices, such as the memory controller 30 or processor 12, that may be sent through the command bus 50 (see FIGS. 1 and 2). Additionally, the control block 64 may accept an external system clock signal (XCLK) and synchronize certain operations of the memory device 58 with the operation of other devices within the system.

The exemplary memory device 58 of FIG. 4 may include a driver array 66 to speed the transmission of data on the data bus 48. The driver array 66 may include larger transistors configured to quickly drive a transmission line to a desired voltage. The driver array 66 may accept data from the memory access block 60 and drive a transmission line in the data bus 48 to the appropriate voltage. An internal data bus 68 may carry data signals between the memory access block 60 and the driver array 66. Because the memory access block 60 may employ small-densely packed transistors to conserve space, the signals on the internal data bus 60 may be relatively weak compared to the signals transmitted by the driver array 66. Thus, the driver array 66 may strengthen signals carried on the internal data bus 68 to speed the propagation of the signals on the data bus 48.

A sequence of data flows through the driver array 66. Each individual bus within the internal data bus 60 and the data bus 48 carries a sequence of data values. A single data value is referred to as a "data segment." For example, the voltage of a individual bus on the data bus 48 at a given instant in time may convey a single data segment. In a binary system, a data segment is one bit. However, other systems may employ larger data segments, such as systems that distinguish between four discrete voltages.

FIG. 5 illustrates an exemplary driver array 66 in accordance with the present techniques. The driver array 66 accepts a data signal on the internal data bus 68. The data signal may be a data word, for instance. Depending on the data word size, the internal data bus 68 may include a number of individual data buses 68A-68C, such as 8, 16, 32, 64, or 128, for example. The individual data buses 68A-68C may each communicatively couple to a driver circuit 70A-70C. The number of driver circuits 70A-70C may match the number of individual buses on the internal data bus 68. Each driver circuit 70A-70C may strengthen the signal on one individual data bus 68A-68C. Each driver circuit 70A-70C may communicatively couple to a DQ pin 72A-72C. The DQ pins 72A-72C may communicatively couple to transmission lines that carry signals between devices, such as the individual data buses in the data bus 48 depicted in FIG. 4. Thus, the driver circuits 70A-70C may drive the voltage of each DQ pin 72A-72C in response to a signal from the internal data bus 68.

In operation, the driver circuits 70A-70C may simultaneously drive the voltage on DQ pins 72A-72C to transmit a data word. The internal data bus 68 may carry a data word to the driver circuits 70A-70C from the memory access block 60. In response, the driver circuits 70A-70C may drive the voltage on each DQ pin 72A-72C to transmit the signals from the internal data bus 68 to external devices. Once the voltage of the transmission line coupled to each DQ pin 72A-72C reaches the appropriate voltage, a receiving device (not shown) may sense the voltage on the transmission lines to read the data word. After the receiving device senses the data word, the driver circuits 70A-70C may repeat the process, transmitting a new data word from the internal data bus 68.

An exchange bus 69 may connect a number of the driver circuits 70A-70C. Each driver circuit 70A-70C may send and receive signals on the exchange bus 69. The exchange bus 69 may include a number of individual buses to connect the driver circuits 70A-70C. The number of individual buses may depend on the number of driver circuits 70A-70C and the number of connections between the driver circuits 70A-70C. The specific number of connections between the driver circuits 70A-70C may vary depending on the specific design, as described further below.

Advantageously, each driver circuit 70A-70C may compensate for data dependent noise, such as cross-talk and simultaneous switching noise. Each driver circuit 70A-70C may receive signals from other driver circuits 70A-70C through the exchange bus 69. The type of data dependent noise compensated for by the driver circuit 70A-70C may determine, in part, the number of connections between the driver circuits 70A-70C. For instance, an embodiment directed toward compensating for cross-talk, each driver circuit 70A-70C may connect to a pair of adjacent driver circuits 70A-70C. In contrast, an embodiment directed toward both cross-talk and simultaneous switching noise, each driver circuit 70A-70C may connect to every other driver circuit 70A-70C, for example.

The connections between the driver circuits 70A-70C may indicate to each driver circuit 70A-70C the sequence of data segments that other driver circuits 70A-70C will drive. For example, in an embodiment directed toward compensating for cross-talk, each driver 70A-70C may receive consecutive data segments that adjacent driver circuits 70A-70C will transmit. Similarly, in an embodiment directed toward compensating for cross-talk and simultaneous switching noise, each driver circuit 70A-70C may receive consecutive data segments that every other driver circuit 70A-70C will transmit, or consecutive data words.

The driver circuits 70A-70C may employ information received over the exchange bus 69 to compensate for data dependent sources of variation in signal transmission. For instance, the driver circuit 70A may compare consecutive data words to determine the number of DQs 72A-72C that change value to transmit the latter data word. Depending on the number signals that change value and the direction of the change, the driver circuits 70A may vary its impedance, slew rate, or timing to compensate for simultaneous switching effects.

In a more specific example, the driver circuit 70A may prepare to drive DQ 72A from a low voltage to a high voltage by monitoring the sequence of data words transmitted by the driver array 66. The driver circuit 70A may compare the data word that is about to be transmitted to the data word currently being transmitted to determine the number of driver circuits 70A-70C that will drive a transmission line from a low voltage to a high voltage at the same time. If the driver circuit 70A determines that a large number of drivers are making this transition at the same time, the driver circuit 70A may increase its own slew rate, advance its timing, or adjust its impedance to compensate for a larger simultaneous switching effect. Alternatively, if a driver circuit 70A determines that simultaneous switching effects may slow the operation of other driver circuits 70B-70C, the driver circuit 70A may adjust to synchronize with the other driver circuits 70B-70C. Moreover, each driver circuit 70A-70C may make similar adjustments to reduce simultaneous switching effects.

In a similar manner, a driver circuit 70A-70C may adjust for cross-talk by monitoring the voltages transmitted on adjacent DQs 72A-72C. For instance, driver circuit 70B may monitor the sequence of signals transmitted by driver circuit 70A and driver circuit 70C. If the driver circuit 70B determines that cross-talk might delay propagation of a signal it is about to transmit, the driver circuit 70B may drive the signal sooner, with a higher slew rate, or with different impedance to compensate for propagation delay. Alternatively, driver circuit 70B may determine that cross-talk from a signal it will transmit may interfere with one of the other drivers and adjust its own signal to reduce interference with signals from other drivers. Thus, by monitoring the operation of the other driver circuits 70A-70C, each driver circuit 70A-70C may adjust the impedance, slew rate, or timing of its own signals to reduce data dependent noise.

It should be noted that other embodiments in accordance with the present techniques may not employ an exchange bus 69. For example, the internal data bus 68 or a plurality of individual buses 68A-68C may couple to each driver circuit 70A-70C. The driver circuits 70A-70C may include a buffer to compare consecutive signals from the internal data bus 68.

Figure 6:
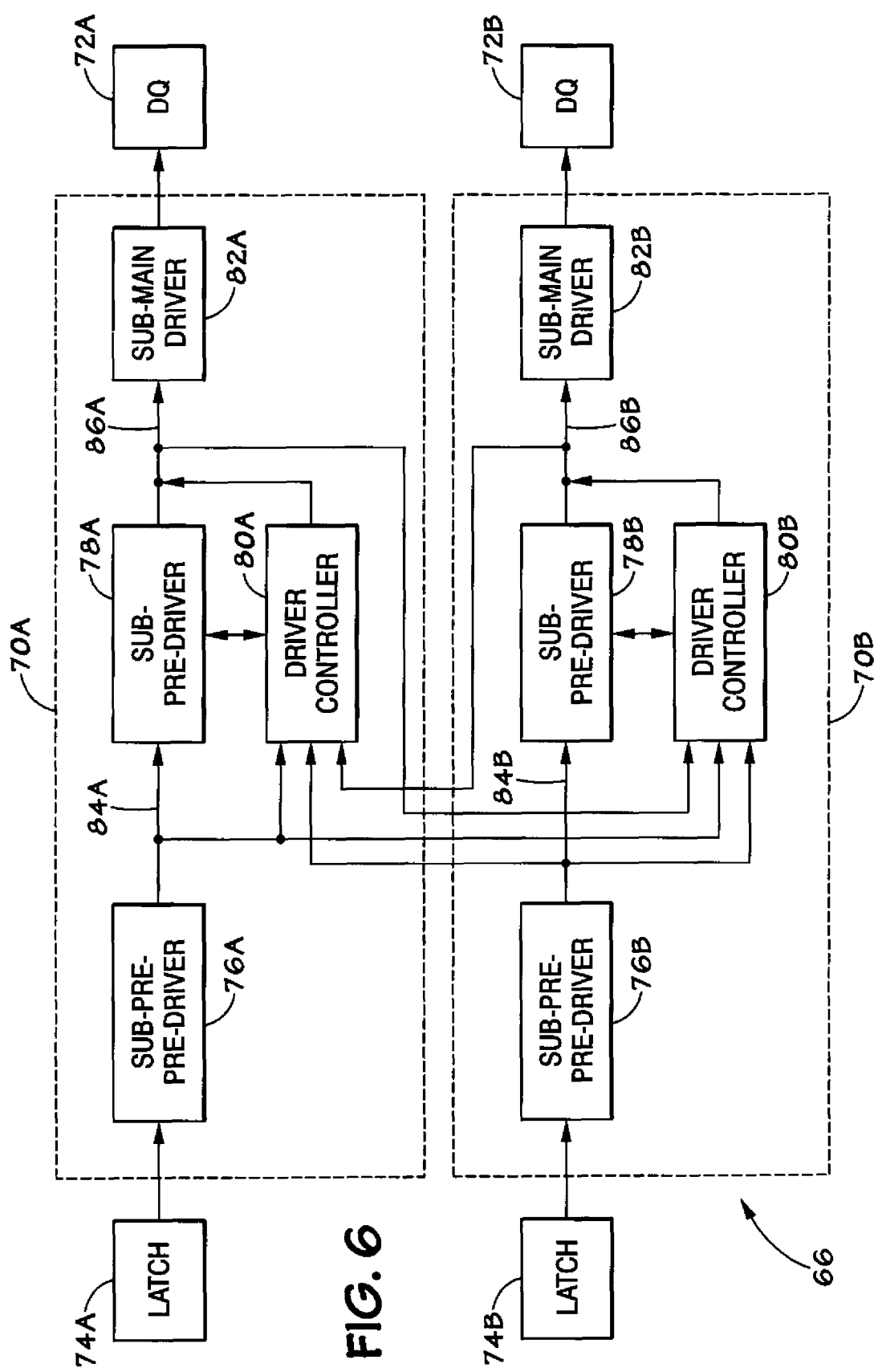
FIG. 6 illustrates a block diagram of an exemplary driver array employing a driver controller in accordance with embodiments of the present invention.

FIG. 6 depicts an exemplary driver array 66 employing a pair of exemplary driver circuits 70A and 70B to illustrate how the driver circuits 70A and 70B may compensate for data dependent noise. To simplify explanation of the various connections, the embodiment of FIG. 6 includes two driver circuits 70A and 70B driving signals on two DQ pins 72A and 72B. However, it should be noted that other embodiments employing similar components may be configured to drive larger data words. The data signals to be transmitted by the driver circuits 70A and 70B may be received from latches 74A and 74B. The memory access block 60 depicted in FIG. 4 may include these latches 74A and 74B, for instance.

Driver circuit 70A may include various stages, each including a sub-driver, and each stage increasing the amount of current carrying a signal. For instance, the driver 70A may include three stages or sub-drivers, illustrated here as the sub-pre-pre-driver 76A, the sub-pre-driver 78A, and the sub-main driver 82A. Sub-pre-pre-driver 76A may receive a signal from the latch 74A. In a binary system, the signal from latch 74A may represent one bit of data in the form of either a high or low voltage applied to the input of sub-pre-pre-driver 76A. In response to the signal from latch 74A, the sub-pre-pre-driver circuit 76A may transmit a stronger signal 84A to a sub-pre-driver 78A. The sub-pre-pre-driver circuit 76A may strengthen the signal from latch 74A by employing larger transistors than those employed in the latch 74A. The larger transistors may conduct a signal with more current. To transmit the strengthened signal 84A, the output of sub-pre-pre-driver 76A may communicatively couple to the input of a sub-pre-driver 78A.

A sub-pre-driver 78A may increase the strength of signal 84A even further. The sub-pre-driver 78A may receive signal 84A from the sub-pre-pre-driver circuit 76A. To deliver a signal with more current and/or a higher voltage that that signal 84A, the sub-pre-driver 78A may employ larger transistors and a different power source than sub-pre-pre-driver 76A. In response to signal 84A, the sub-pre-driver 78A may output a stronger signal 86A. To deliver the signal 86A, the output of sub-pre-driver 78A may be communicatively coupled to a sub-main driver 82A.

In a last stage, a sub-main driver 82A may drive the voltage of a DQ pin 72A to transmit a signal to another device. The sub-main driver 82A may receive signal 86A through an input. To further strengthen the signal, the sub-main driver 82A may include larger transistors and/or a different power source than the sub-pre-driver 78A. The sub-main driver 82A may communicatively couple to a DQ pin 72A, which in turn may communicatively couple to a transmission line (not shown).

During operation, the sub-main driver 82A may drive the voltage on a transmission line to transmit data to another device. For instance, if the transmission line is at a low voltage and the next data word being transmitted calls for a high voltage on the transmission line, the sub-main driver 82A may close a connection to a high voltage current source (not shown) to raise the voltage on the transmission line. Similarly, if the transmission line is at a high voltage and the next data word being transmitted calls for a low voltage on the transmission line, the sub-main driver 82A may close a connection to a low voltage current source (not shown) to lower the voltage on the transmission line. In the event that the voltage of the transmission line matches the voltage called for by the next data word being transmitted, the sub-main driver 82A may still open a connection to a current source. However, without a voltage differential, little current may flow through the sub-main driver 82A. In short, the sub-main driver 82A may drive DQ 72A and a transmission line connected to DQ 72 to a voltage that is representative of signal 86A.

A driver array 66 may include a plurality of drivers similar to the driver circuit 70A that was just described. For instance, the present embodiment may employ two driver circuits 70A and 70B. Driver circuit 70B may be similar to driver circuit 70A, including a sub-pre-pre-driver 76B coupled to a latch 74B, a sub-pre-driver 78B coupled to the sub-pre-pre-driver 76B, and a sub-main driver 82B coupled to the sub-pre-driver 78B. In a manner similar to the operation of driver circuit 70A, these components may accept a signal from latch 74B, for example a voltage representing one bit of data, and drive the signal on a transmission line. For instance, sub-pre-pre-driver 76B may transmit a strengthened signal 84B to sub-pre-driver 78B. Similarly, sub-pre-driver 78B may transmit an even stronger signal 86B to the sub-main driver 82B. Finally, sub-main driver 82B may drive the voltage on DQ 72B to the appropriate voltage. Thus, driver circuit 70B may also transmit one or more bits of data by adjusting the voltage of a transmission line coupled to another device.

Driver circuits 70A and 70B may operate synchronously. For instance, the driver circuits 70A and 70B may cooperate to transmit a data word, such as a two-bit data word in a binary system. Each driver circuit 70A and 70B may drive a transmission line to a voltage representative of one of the bits at the same time. A receiving device may sense both transmission lines at the same time to receive the data word. The driver circuits 70A and 70B may repeat this operation to transmit a sequence of data words to another device.

Driver circuits 70A and 70B may include various components to synchronize their operation. Sub-main drivers 82A and 82B may be calibrated to match the impedance of the transmission line connected to their respective DQs 72A and 72B. Similarly, the sub-pre-drivers 78A and 78B may be configured to delay or advance a signal to compensate for process variation and temperature induced delays. In some embodiments, sub-pre-drivers 78A and 78B may include fuses that may be blown to adjust the transmission of a signal.

To further synchronize their operation, driver circuits 70A and 70B may include components that may compensate for data dependent noise, such as cross-talk and simultaneous switching noise. For example, driver circuit 70A may include a driver controller 80A communicatively coupled to the sub-pre-driver 78A. The driver controller 80A may compensate for data dependent variation in the time the driver circuit 70A takes to transmit a signal. The driver controller 80A may receive a variety of signals that may correlate with data dependent variation in transmission times. By monitoring these signals, the driver controller 80A may predict the degree to which data dependent delays will affect the transmission of the data carried by signal 84A when transmitted by the sub-main driver 82A. In response, the driver controller 80A may compensate for an expected delay by altering signal 86A, for example by adjusting the rate at which signal 86A changes to reflect this data carried by signal 84A.

The driver controller 80A may compensate for data dependent noise by adjusting the slew rate of signal 86A. Again, slew rate refers to a rate of change of a voltage. Thus, the driver controller 80A may adjust the rate at which signal 86A changes from a voltage reflecting the previous data segment carried by signal 84A to a voltage reflecting the current data segment carried by signal 84A. For example, the driver controller 80A may predict that data dependent noise will slow the transmission of the data segment carried by signal 84A when it is transmitted by the sub-main driver 82A. In response, the driver controller 80A may increase the slew rate of signal 86A as signal 86A transitions from a voltage reflecting the previous data segment to a voltage reflecting the data segment carried by signal 84A. As a result, the sub-main driver 82A may drive the transmission line to a voltage reflecting this data segment at a faster slew rate, compensating for the expected delay. Alternatively, the driver controller 80A may determine that data dependent noise will slow the transmission of signals carried by other drivers, such as driver circuit 70B. To synchronize driver circuit 70A with driver circuit 70B, driver controller 80A may lower the slew rate of signal 86A as signal 86A changes to reflect the data segment carried by signal 84A. In some embodiments, the driver controller 80A may both lower the slew rate of signal 86A in some circumstances and raise the slew rate of signal 86A in other circumstances to synchronize the signals transmitted by the driver circuits 70A and 70B.

The slew rate of signal 86A may determine when DQ 72A reaches a voltage that reflects the data segment carried by signal 86A. Sub-main driver 82A may accept signal 86A as an input and drive the voltage on the DQ 72A and an accompanying transmission line to a voltage that indicates to a receiving device the content of the data segment carried by signal 86A. The rate at which signal 86A transitions from one value to the next, i.e. its slew rate, may determine the rate at which sub-main driver 82A drives the voltage of the DQ 72A from one voltage to another, i.e. the slew rate of the sub-main driver 82A. Thus, the slew rate of signal 86A may affect the time at which a signal reaches the receiving device. Advantageously, the driver controller 80A may adjust the slew rate of the sub-main driver 82A to synchronize the time at which transmitted signals arrive at the receiving device.

The driver controller 80A may monitor consecutive data segments to determine when a slew rate adjustment may be desirable. For instance, the driver controller 80A may receive signal 84A, indicating the data segment that sub-pre-driver 78A is about to transmit to the sub-main driver 82A, and signal 86A, indicating the previous data segment that sub-pre-driver 78A transmitted to the sub-main driver 82A. With these two signals 84A and 86A, the driver controller 80A may determine if the previous data segment transmitted by the sub-pre-driver is different than the data segment the sub-pre-driver 78A is about to transmit. For example, in a binary system, signals 84A and 86A may carry one bit in the form of a high or low voltage. As a result, the consecutive signals may frequently be the same, preventing an adjustment to the slew rate of signal 86A because the voltage of signal 86A remains unchanged when the data carried by signal 84A is advanced to the sub-main driver 82A. However, at other times, consecutive bits may have different values, and the driver controller 80A may adjust the rate at which signal 86A changes between voltages reflecting one value and the next value.

The driver controller 80A may monitor a variety of signals to predict when data dependent noise is likely to interfere with the transmission of a signal. For instance, the driver controller 80A may monitor the voltage transitions being driven by a plurality of other drivers. In the embodiment of FIG. 6, with two driver circuits 70A and 70B, driver controller 80A in driver circuit 70A may monitor the sequence of signals transmitted by driver circuit 70B. To this end, the driver controller 80A may receive signal 84B, indicating the data sub-predriver 78B is about to transmit, and signal 86B, indicating the data that sub-pre-driver 78B is currently transmitting. With this data, the driver controller 80A may determine when sub-main driver 82B will drive DQ 72B from one voltage to another.

The driver controller 80A may compensate for simultaneous switching noise. Again, simultaneous switching noise is often caused by multiple drivers attempting to drive the voltage on multiple transmission lines in the same direction at the same time, resulting in a current spike. Parasitic induction resulting from the current spike may slow the transition and add variation to the time the drivers take to transmit a data word. The magnitude of the effect may depend on the value of the previous data word and the current data word. The more transmission lines changing voltage in the same direction between data words, the greater the effect.

The driver controller 80A may compensate for simultaneous switching effects by adjusting the slew rate of signal 86A. For example, if the driver controller 80A determines that the sub-main driver 82A will drive DQ 72A from a low voltage to a high voltage at the same time that sub-main driver 82B will drive DQ 72B from a low voltage to a high voltage, the driver controller 80A may increase the slew rate of signal 86A during this sequence of data segments. Advantageously, increasing the slew rate of signal 86A may compensate for simultaneous switching delays by preemptively advancing the signal more quickly. Thus, while multiple drivers transitioning from a low voltage to a high voltage at the same time may tend to slow the transition, increasing the slew rate of the sub-pre-driver 78A may mitigate the effect. Similarly, if driver controller 80A determines that sub-main drivers 82A and 82B will transition from a high voltage to a low voltage at the same time, the driver controller 80A may increase the slew rate of signal 86A to compensate. Thus, the driver controller 80A may synchronize the transmission of signals from driver circuit 70A with the transmission of signals from other drivers by monitoring the sequence of data segments the other drivers are transmitting.

It should be noted that driver controller 80A may lower the slew rate of signal 86A in certain embodiments. For example, the driver controller 80A may determine that DQ 72A is likely to achieve a desired voltage sooner than the other DQs. To synchronize the transition of DQ 72A with the other DQs, such as DQ 72B, the driver controller 80A may lower the slew rate of signal 86A.

Additionally, or alternatively, the driver controller 80A may compensate for cross-talk. For example, driver controller 80A may monitor drivers coupled to adjacent transmission lines to estimate the degree to which cross-talk is likely to affect the transmission of a signal through DQ 72A. If the driver controller 80A determines that the voltages and currents on adjacent transmission lines are likely to interfere with the transmission of a signal through DQ 72A, the driver controller 80A may alter the slew rate of signal 86A to compensate for these effects. Thus, in the embodiment of FIG. 6, driver controller 80A may also employ signals 86B and 84B to predict the degree to which the currents and voltages in a transmission line coupled to DQ 72B will affect a signal transmitted through DQ 72A. In response, the driver controller 80A may raise or lower the slew rate of signal 86A as is appropriate to compensate for the expected cross-talk effects.

Advantageously, in certain embodiments, the driver controller 80A may compensate for both simultaneous switching effects and cross-talk effects. The driver controller 80A may reduce data dependent noise by addressing both propagation delays and signal generation delays that vary with the sequence of data being transmitted. However, other embodiments in accordance with the present technique may address only one of these effects and/or other sources of data dependent noise.

It should be noted that other embodiments in accordance with the present technique may compensate for data dependent noise by adjusting parameters other than the slew rate. For example, other embodiments may vary the time at which a signal is advanced, the impedance of portions of the driver circuit 70A, or any other parameter in a manner that counteracts data dependent noise. Moreover, some embodiments in accordance with the present technique may modify some combination of these parameters to compensate for data dependent noise.

A plurality of drivers may include a driver controller that is similar to driver controller 80A, for instance every driver. In the embodiment of FIG. 6, driver circuit 70B may include a driver controller 80B, which may be similar to driver controller 80A. Driver controller 80B may couple to the input and output of sub-pre-driver 78B, receiving signals 84B and 86B. Much like the previously discussed driver controller 80A, driver controller 80B may monitor the operation of driver circuit 70A to determine when data dependent effects are likely to interfere with the transmission of a signal from driver circuit 70B. Moreover, the driver controller 70B may alter various parameters within driver circuit 70B to compensate for these sources of variation, for example by changing the slew rate of signal 86B. To this end, driver controller 78B may couple to the input and output of sub-pre-driver 78A, receiving signals 84A and 86A. Thus, driver circuit 70B may employ driver controller 70B to reduce data dependent variations in the time it takes to transmit a data segment.

The present techniques are not limited to driver arrays 66 employing two drivers. Other embodiments may employ a larger number of drivers to drive larger data words. These other embodiments may employ a driver controller in a number of the drivers, for example every driver. In embodiments employing more than two drivers, the driver controllers in each driver may monitor the operation of a number of other drivers. For example, in some embodiments, every driver controller may receive each data word, a portion of each data word, or the portion of each data word passing through adjacent drivers. Moreover, to monitor consecutive signals, some embodiments may employ driver controllers coupled to two stages of other drivers, such as before and after a sub-pre-driver, before and after the sub-main driver, before and after the sub-pre-pre-driver, or before and after some series of these components, for example. However, embodiments in accordance with the present technique may employ driver controllers coupled to other drivers at only one point or driver controllers coupled directly to an internal data bus 68. These embodiments may employ a buffer with the driver controller to compare consecutive data segments.

Figure 7:
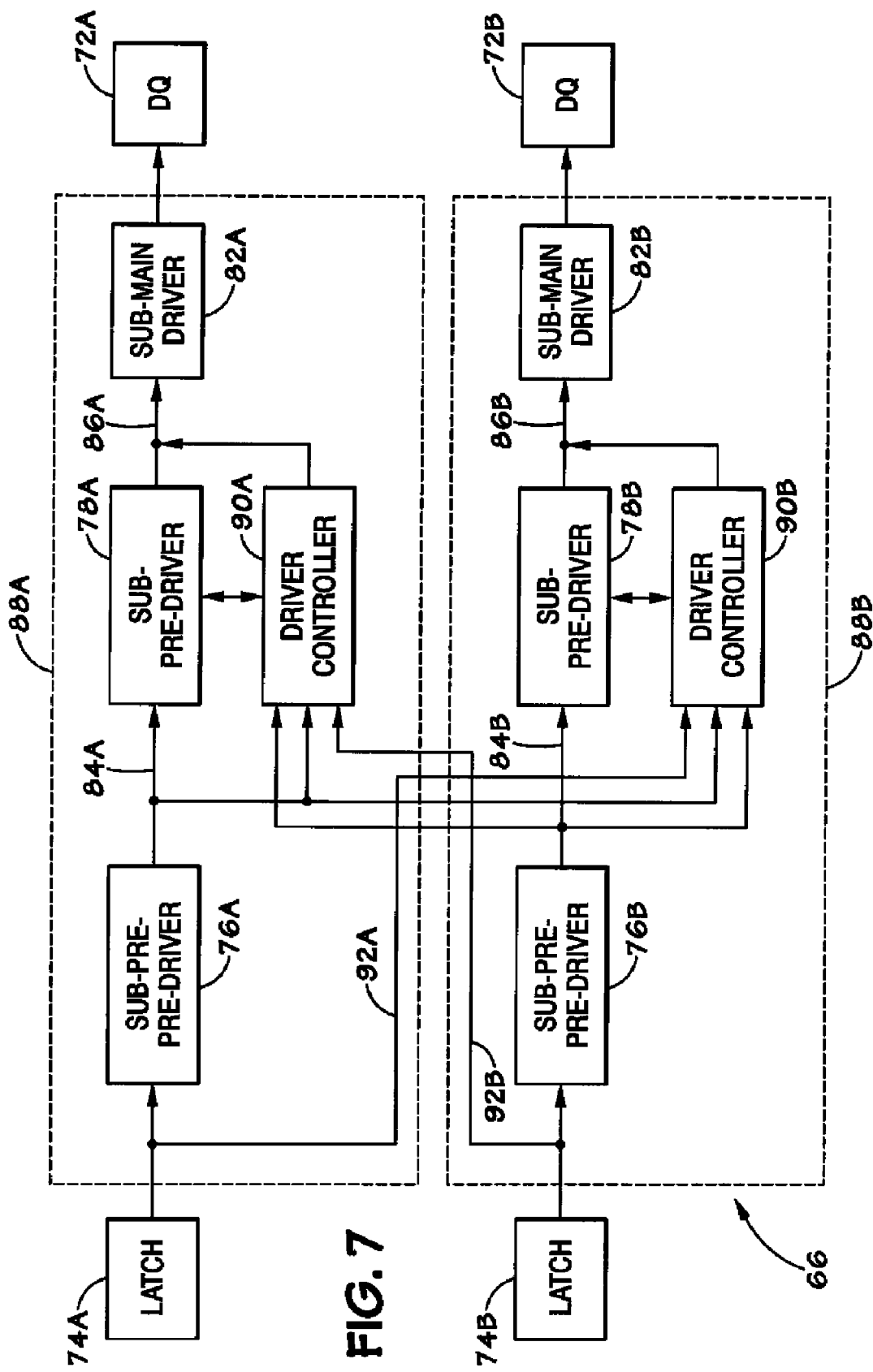
FIG. 7 illustrates a block diagram of a second embodiment of an exemplary driver array employing a driver controller in accordance with embodiments of the present invention.

FIG. 7 illustrates an alternate embodiment of a driver array 66 in accordance with the present techniques. The embodiment of FIG. 7 may employ driver controllers 90A and 90B that may perform a function similar to the function performed by previously discussed driver controllers 80A and 80B. However, driver controllers 90A and 90B may be configured to receive feed forward signals 92A and 92B. By comparing signal 92A to signal 84A and signal 92B to signal 84B, driver controllers 90A and 90B may monitor one anothers' operation. Using this information, driver controllers 90A and 90B may compensate for data dependent noise, such as cross-talk and simultaneous switching noise. To compensate, the driver controllers 90A and 90B may alter various parameters of the drivers 88A and 88B, such as the slew rate of signal 86A and 86B respectively, for example. The driver controllers 90A and 90B may direct an adjustment to signal 86A and 86B when these signals are transitioning to transmit the data carried by signals 92A and 92B respectively.

Figure 8:
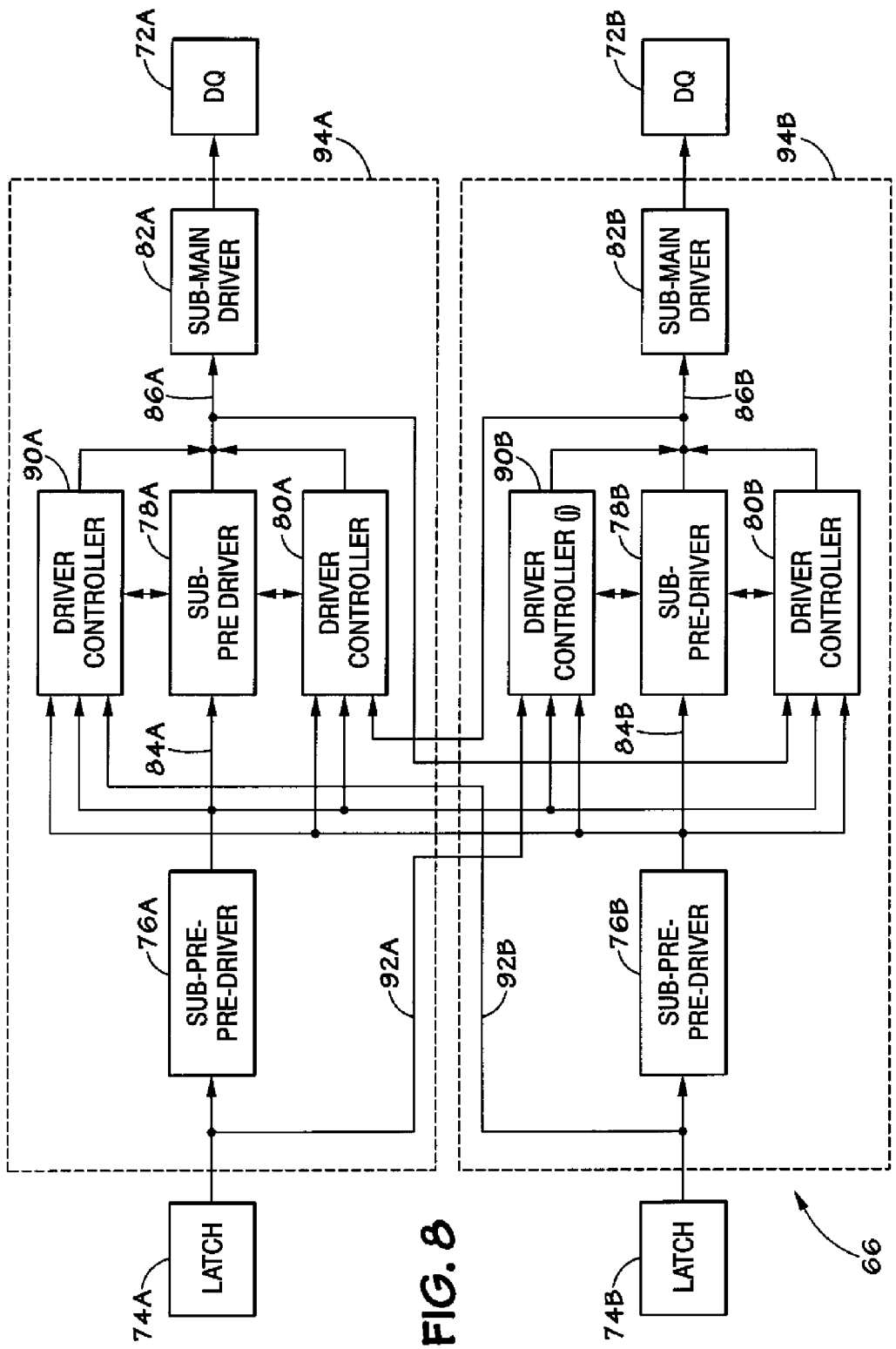
FIG. 8 illustrates a block diagram of a third embodiment of an exemplary driver array employing a driver controller in accordance with embodiments of the present invention.

FIG. 8 illustrates a third embodiment of a driver array 66 in accordance with the present techniques. The driver 94A may include driver controllers 80A and 90A that may be similar to those employed in the embodiments depicted by FIGS. 6 and 7 respectively. The pair of driver controllers 80A and 90A may cooperate to reduce data dependant variation in signal transmissions. For instance, both driver controllers 80A and 90A may cooperate to compensate for simultaneous switching effects and cross-talk effects. For example, the driver controllers 80A and 90A may adjust the slew rate of signal 86A. Similarly, driver 92B may employ driver controllers 80B and 90B to adjust signal 86B.

FIG. 9 depicts an exemplary operation 96 of a driver controller manufactured in accordance with certain embodiments of the present techniques. In a first step 98, the driver controller may determine if a driver circuit will drive a voltage or current transition. This step may include comparing consecutive data segments. If the consecutive data segments are different, then the driver circuit will drive a voltage transition. Moreover, this step may also include determining the direction of the transition. For example, the step 98 may include determining if the driver circuit will drive a voltage transition from a low voltage to a high voltage or from a high voltage to a low voltage. For brevity, the voltage transition identified in the first step 98 is referred to as the "domestic transition."

In a second step 100, the driver controller may compare the domestic transition to the state of another driver circuit. The state of another driver circuit refers to the voltage or voltages or current or currents that the driver circuit will drive around the time that the domestic transition occurs. Thus, the state of another driver circuit may depend on the sequence of voltages that the other driver circuit will drive before, during, and immediately after the domestic transition. In other words, the state of another driver circuit depends on the sequence of data segments transmitted by the other driver circuit. For example, the state of another driver circuit may depend on the consecutive data segments driven by the other driver circuit before and after the domestic transition.

The comparison in step 100 may involve determining if the state of another driver circuit will interfere with the domestic transition. For example, the comparison may include determining if cross-talk will affect the domestic transition. To this end, the comparison in step 100 may include determining if a transmission line adjacent to the driver circuit will change voltage at the same time as the domestic transition and if the adjacent transmission line's change in voltage is likely to cause cross-talk. Alternatively, or additionally, the comparison may include determining the voltage and/or current on an adjacent transmission line during the domestic transition, immediately before the domestic transition, or immediately after the domestic transition and if these voltage and/or currents are likely to cause cross-talk.

Additionally, or alternatively, the comparison of step 100 may include determining if simultaneous switching noise is likely to affect the domestic transition. To determine this, the driver controller may determine if the other driver circuit will drive a voltage transition at the same time as the domestic transition. Additionally, the driver controller may determine if the other driver circuit will drive a voltage transition in the same direction as the domestic transition, for example, if both driver circuits will drive a transmission line from a high voltage to a low voltage at the same time.

Some embodiments in accordance with the present technique may compare the state of a plurality of other driver circuits to the domestic transition. For instance, a driver controller may compare the state of two other driver circuits to the domestic transition. To predict cross-talk, each of the other driver circuits may be adjacent to the driver circuit undergoing the domestic transition, as adjacent transmission lines are likely to have the largest cross-talk effect.

Similarly, to predict a simultaneous switching effect, the driver controller may compare the state of a plurality of other driver circuits to the domestic transition. For instance, the driver controller may compare the state of every other driver circuit to the domestic transition. The driver controller may determine the number of other driver circuits that will drive a voltage transition in the same direction as the domestic transition at the same time. That is, the driver controller may determine number of driver circuits that are simultaneously switching from a low voltage to a high voltage or from a high voltage to a low voltage. However, as will be appreciated, the present techniques are also applicable to current mode drivers.

In a third step 102, the driver controller may adjust a parameter of the domestic transition based on the comparison of step 100. The adjustment may be based on some expected source of data dependent noise, such as a cross-talk effect and/or a simultaneous switching effect. For instance, the comparison of step 100 may indicate that cross-talk is likely to affect the domestic transition. The driver controller may adjust a parameter of the domestic transition based on this prediction. The driver controller may change one parameter or a number of parameters, such as the slew rate of the domestic transition, the time at which the domestic transition occurs, the impedance of the driver circuit that drives the domestic transition, or any other parameter that may compensate for data dependent noise.

The adjustment in step 102 may compensate for the data dependent noise predicted by the comparison of step 100. For example, the comparison of step 100 may indicate that cross-talk or simultaneous switching noise will likely slow the domestic transition. In response, the driver controller may adjust a parameter of the domestic transition to compensate. The adjustment may include increasing the slew rate, performing the domestic transition earlier, changing the impedance of the driver circuit undergoing the domestic transition, or any combination of these adjustments.

Conversely, if the driver controller determines that cross-talk or simultaneous switching noise will likely accelerate the domestic transition, it may take steps to compensate. For instance, the driver controller may decrease the slew rate of the domestic transition, delay the domestic transition, change the impedance of the driver circuit undergoing the domestic transition, or some combination of these adjustments.

Figure 10:
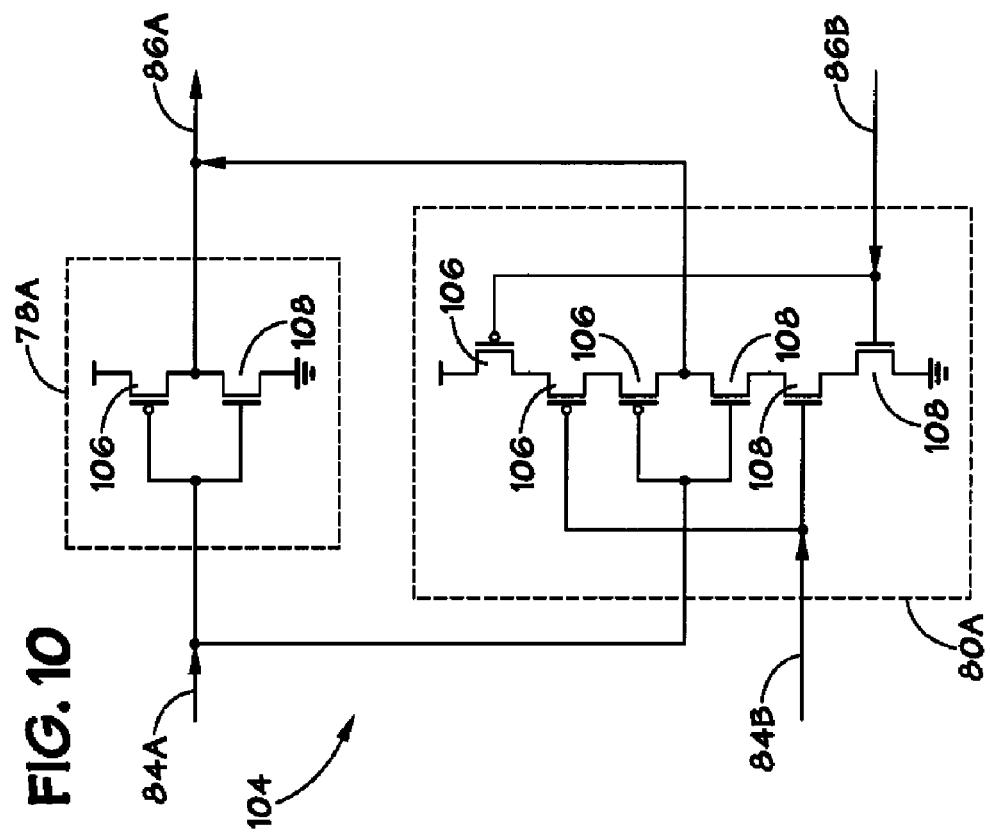
FIG. 10 is a circuit diagram depicting an exemplary sub-pre-driver and an exemplary driver controller in accordance with embodiments of the present invention.

FIG. 10 is a circuit diagram that depicts a circuit 104 with an exemplary sub-pre-driver 78A and an exemplary driver controller 80A. The circuit 104 may include a number of p-type transistors 106 and n-type transistors 108. The circuit 104 includes signal 86B as an input. However, other embodiments may employ other signals as an input, such as 92B, depending on the configuration. It should also be noted that the exemplary driver controller 80A of circuit 104 may be employed in place of driver controller 90A.

Figure 11:
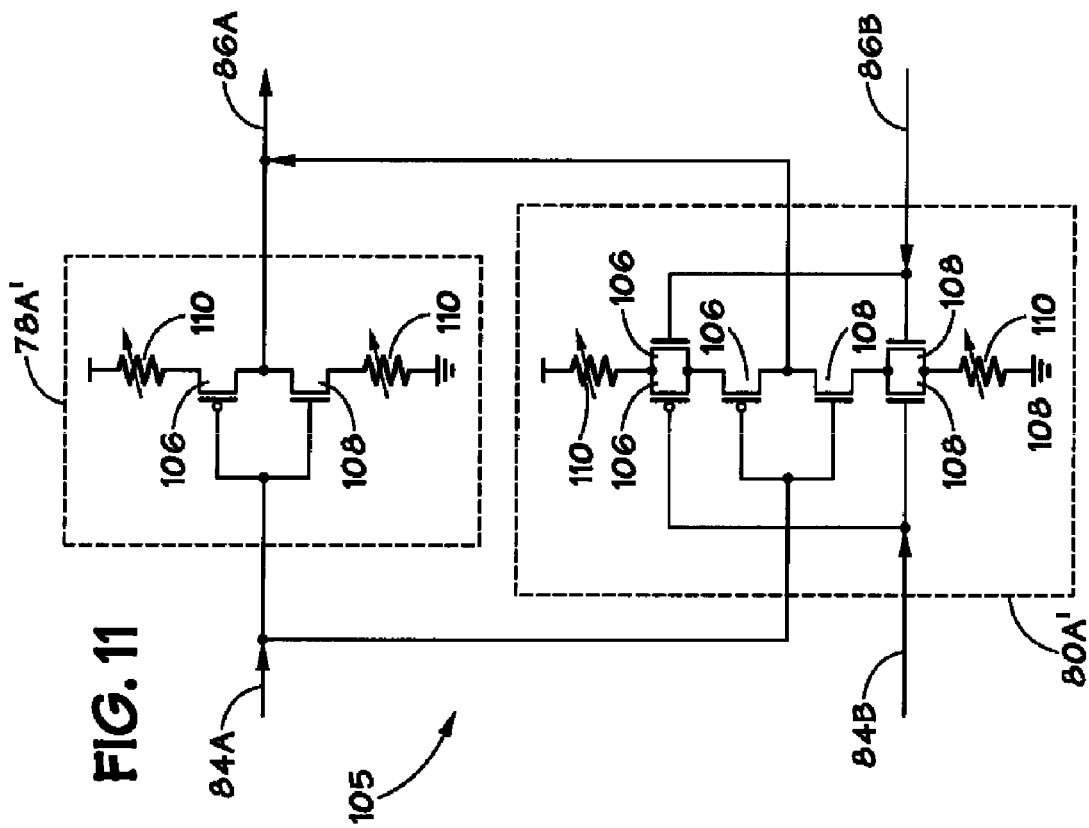
FIG. 11 is a circuit diagram depicting an alternate embodiment of a exemplary sub-pre-driver and an exemplary driver controller in accordance with embodiments of the present invention.

FIG. 11 is a circuit diagram that depicts a circuit 105 with an alternate embodiment of an exemplary sub-pre-driver 78A' and an exemplary driver controller 80A'. The circuit 105 may include variable p-type transistors 106, variable n-type transistors 108, and variable resistors 110. Again, depending on the configuration, signal 92B may be employed as an input instead of or in combination with signal 86B. Driver controller 80 A' may be used in place of driver controllers 80A and 90A, for instance.

As will be appreciated by those skilled in the art, applications of the present techniques are not limited to voltage mode drivers integrated into a memory device. For example, a drive controller in accordance with the present techniques may be configured to compensate for sources of data dependent noise in a current mode driver. Thus, in one embodiment, a driver controller may monitor the currents driven by a number of drivers and adjust a delay, a slew rate, and/or the impedance of a driver to compensate for cross-talk and/or simultaneous switching noise. Moreover, the present techniques may be employed in any on-chip or off-chip interface, such as a multi-drop stub interface, a point-to-multiple-point interface, and a point-to-point interface, for instance.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method, comprising:
    receiving a plurality of voltage transitions at a plurality of latches wherein the plurality of voltage transitions include data dependent noise;
    increasing the magnitude of the plurality of voltage transitions between the plurality of latches and a plurality of DQs; and
    transmitting the plurality of voltage transitions from the plurality of DQs to a receiving device such that each voltage transition arrives at the receiving device at substantially the same time.

2. The method of claim 1, wherein transmitting the plurality of voltage transitions comprises:
    comparing each voltage transition with one or more other voltage transitions; and
    adjusting one or more characteristics of one or more of the plurality of voltage transitions based on the comparison to compensate for a delay induced by data dependent noise.

3. The method of claim 2, wherein adjusting one or more characteristics of one or more of the plurality of voltage transitions comprises delaying or advancing one or more of the plurality of voltage transitions.

4. The method of claim 2, wherein adjusting one or more characteristics of one or more of the plurality of voltage transitions comprises adjusting a slew rate of one or more of the plurality of voltage transitions.

5. The method of claim 2, wherein the delay induced by data dependent noise comprises cross-talk between a plurality of transmission lines.

6. The method of claim 2, wherein the delay induced by data dependent noise comprises simultaneous switching noise.

7. A method, comprising:
    receiving a plurality of voltage transitions wherein the plurality of voltage transitions include data dependent noise;
    increasing the magnitude of the plurality of voltage transitions; and
    transmitting the plurality of voltage transitions to a receiving device such that each voltage transition arrives at the receiving device at substantially the same time.

8. The method of claim 7, wherein transmitting the plurality of voltage transitions comprises comparing each voltage transition with one or more other voltage transitions.

9. The method of claim 8, wherein transmitting further comprises adjusting one or more characteristics of to compensate for a delay induced by data dependent noise.

10. The method of claim 9, wherein adjusting comprises adjusting a slew rate.

11. The method of claim 7, wherein transmitting the plurality of voltage transitions comprises increasing or decreasing a voltage in one or more discrete increments.

12. The method of claim 7, wherein transmitting the plurality of voltage transitions comprises transmitting each of the plurality of voltage transitions one a respective one of a plurality of transmission lines.

13. The method of claim 7, wherein transmitting the plurality of voltage transitions comprises delaying or advancing one or more of the plurality of voltage transitions such that each voltage transition arrives at the receiving device at substantially the same time.

14. A method, comprising:
    receiving a domestic transition having data dependent noise from a first driver circuit;
    comparing the domestic transition with a second transition of a second driver circuit;
    transmitting the domestic transition and the second transition such that each voltage transition arrives at the receiving device at substantially the same time; and
    increasing an amplitude of the domestic transition.

15. The method of claim 14, wherein transmitting comprises adjusting a parameter of the domestic transition or the second transmission based on the comparison of the domestic transition with the second transition.

16. The method of claim 14, wherein increasing an amplitude comprises increasing a voltage amplitude.

17. The method of claim 14, wherein increasing an amplitude comprises increasing a slew rate.

* * * * *